US012690464B2

(12) United States Patent
Hsu

(10) Patent No.: US 12,690,464 B2
(45) Date of Patent: Jul. 21, 2026

(54) SEMICONDUCTOR STRUCTURE, SEMICONDUCTOR DEVICE WITH AIR SPACERS, AND METHOD FOR FABRICATING THE SAME

(71) Applicant: NANYA TECHNOLOGY CORPORATION, New Taipei City (TW)

(72) Inventor: Feng-Wen Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/375,617

(22) Filed: Oct. 2, 2023

(65) Prior Publication Data

US 2025/0112169 A1 Apr. 3, 2025

(51) Int. Cl.
| | |
|---|---|
| *H10W 42/20* | (2026.01) |
| *H10P 14/692* | (2026.01) |
| *H10P 14/694* | (2026.01) |
| *H10W 20/00* | (2026.01) |
| *H10W 20/41* | (2026.01) |
| *H10W 20/46* | (2026.01) |

(52) U.S. Cl.
CPC ....... *H10W 42/20* (2026.01); *H10P 14/69215* (2026.01); *H10P 14/69433* (2026.01); *H10W 20/072* (2026.01); *H10W 20/077* (2026.01); *H10W 20/098* (2026.01); *H10W 20/435* (2026.01); *H10W 20/46* (2026.01)

(58) Field of Classification Search
CPC ............. H10W 20/063; H10W 20/072; H10W 20/077; H10W 20/098; H10W 20/435; H10W 20/46; H10W 20/495
See application file for complete search history.

(56) References Cited

U.S. PATENT DOCUMENTS

| | | | |
|---|---|---|---|
| 2008/0182403 A1* | 7/2008 | Noori .................. | H01L 21/7682 438/618 |
| 2010/0055898 A1* | 3/2010 | Chang ............... | H01L 21/76834 438/653 |
| 2019/0237356 A1* | 8/2019 | Srivastava ............ | H10W 20/46 |
| 2020/0105578 A1* | 4/2020 | Park .................. | H01L 21/76816 |

FOREIGN PATENT DOCUMENTS

TW 201011861 A 3/2010

OTHER PUBLICATIONS

Office Action and and the search report mailed on May 27, 2024 related to Taiwanese Application No. 112146604.

* cited by examiner

*Primary Examiner* — Fazli Erdem
(74) *Attorney, Agent, or Firm* — Xuan Zhang

(57) ABSTRACT

A semiconductor device is provided, which includes a substrate, a first dielectric layer, a conductive layer, and an insulating capping layer. The first dielectric layer is disposed on the substrate. The conductive layer is disposed on the first dielectric layer. The conductive layer comprises a plurality of conductive wires. The insulating capping layer is disposed on the conductive layer, and configured to enclose a plurality of first gaps between the conductive wires to form a plurality of air spacers.

16 Claims, 10 Drawing Sheets

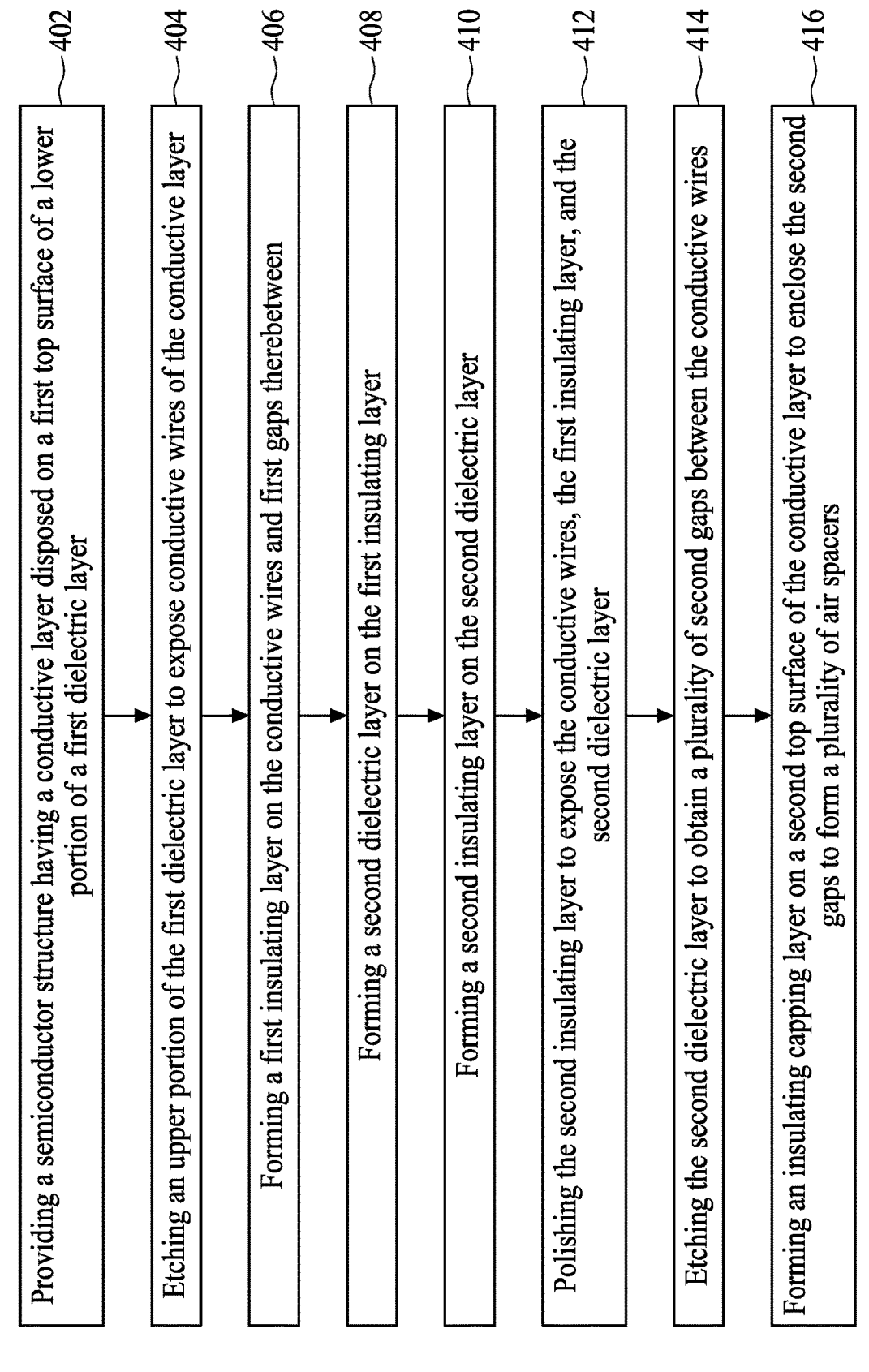

400

Providing a semiconductor structure having a conductive layer disposed on a first top surface of a lower portion of a first dielectric layer — 402

Etching an upper portion of the first dielectric layer to expose conductive wires of the conductive layer — 404

Forming a first insulating layer on the conductive wires and first gaps therebetween — 406

Forming a second dielectric layer on the first insulating layer — 408

Forming a second insulating layer on the second dielectric layer — 410

Polishing the second insulating layer to expose the conductive wires, the first insulating layer, and the second dielectric layer — 412

Etching the second dielectric layer to obtain a plurality of second gaps between the conductive wires — 414

Forming an insulating capping layer on a second top surface of the conductive layer to enclose the second gaps to form a plurality of air spacers — 416

FIG. 4

SEMICONDUCTOR STRUCTURE, SEMICONDUCTOR DEVICE WITH AIR SPACERS, AND METHOD FOR FABRICATING THE SAME

TECHNICAL FIELD

The present disclosure relates to semiconductor devices, and more particularly, to a semiconductor structure, a semiconductor device, and a method for fabricating the same.

DISCUSSION OF THE BACKGROUND

With advances in applied technology, semiconductor devices are smaller while providing increased functionality and more integrated circuitry. However, as their size is reduced, the pitch between metal wires disposed on the same dielectric layer also becomes smaller, resulting in more severe coupling effects between the metal wires and increased electromagnetic noise and crosstalk.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device, which includes a substrate, a first dielectric layer, a conductive layer, and an insulating capping layer. The first dielectric layer is disposed on the substrate. The conductive layer is disposed on the first dielectric layer. The conductive layer comprises a plurality of conductive wires. The insulating capping layer is disposed on the conductive layer, and configured to enclose a plurality of first gaps between the conductive wires to form a plurality of air spacers.

Another aspect of the present disclosure provides a method for fabricating a semiconductor device. The method includes providing a semiconductor structure having a conductive layer disposed on a first top surface of a lower portion of a first dielectric layer; etching an upper portion of the first dielectric layer to expose conductive wires of the conductive layer; and forming an insulating capping layer on a second top surface of the conductive layer to form a plurality of air spacers.

Yet another aspect of the present disclosure provides a semiconductor structure. The semiconductor structure includes a substrate, a first dielectric layer, a plurality of conductive wires, and a plurality of air spacers. The first dielectric layer is disposed on the substrate. The plurality of conductive wires are disposed on the first dielectric layer. The plurality of air spacers are disposed at a plurality of first gaps between the conductive wires along lateral directions of the conductive wires.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

FIG. 4 is a flowchart of a method for fabricating a semiconductor device in accordance with an embodiment of the present disclosure.

DETAILED DESCRIPTION

Figure 1:
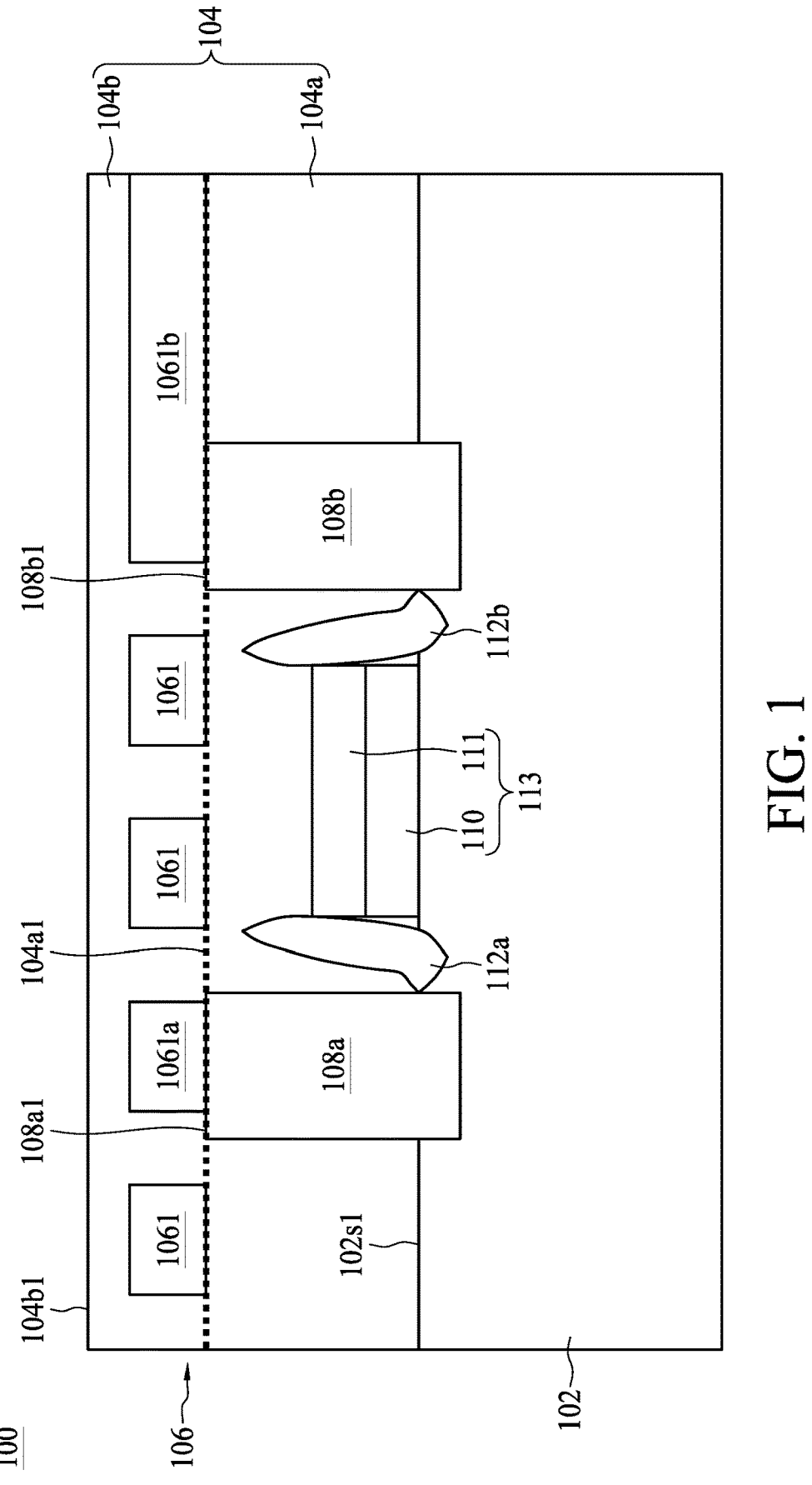
FIG. 1 is a cross section of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

FIG. 1 is a cross section of a semiconductor device in accordance with some embodiments of the present disclosure.

As shown in FIG. 1, a semiconductor device 100 is provided or received. In some embodiments, the semiconductor device 100 may may be or comprise a part of an integrated circuit (IC) die comprising various passive and active microelectronic components such as resistors, capacitors, inductors, diodes, p-type field effect transistors (pFETs), n-type field effect transistors (nFETs), metal oxide semiconductor field effect transistors (MOSFET), complementary metal oxide semiconductor (CMOS) transistors, bicarrier transistors (BJT), laterally diffused MOS (LD-MOS) transistors, high voltage transistors, high frequency transistors, Fin Field Effect Transistors (FinFETs), other suitable IC components or combinations thereof.

The semiconductor device 100 may include a substrate 102, a dielectric layer 104, and a conductive layer 106, as depicted in FIG. 1. The substrate 102 may include a semiconductor substrate such as a silicon substrate. In some embodiments, the substrate 102 may include other elementary semiconductor materials such as germanium (Ge). In some embodiments, the substrate 102 may include a compound semiconductor such as gallium arsenide, gallium phosphide, indium phosphide, indium arsenide, and/or indium antimonide. In some embodiments, the substrate 102 may include an alloy semiconductor such as SiGe, GaAsP, AlInAs, AlGaAs, GaInAs, GaInP, and/or GaInAsP. Alternatively, the substrate 102 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In addition, the substrate 102 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LD-MOS) transistors, high-voltage transistors, high-frequency transistors, fin field-effect transistors (FinFETs), other suitable IC components, or combinations thereof.

Depending on the IC fabrication stage, the substrate 102 may include various material layers (e.g., dielectric layers, semiconductor layers, and/or conductive layers) configured to form IC features (e.g., doped regions, isolation features, gate features, source/drain features, interconnect features, other features, or combinations thereof). For example, a dielectric layer 104 may be formed over the substrate 102 as shown in FIG. 1. In some embodiments, the dielectric layer 104 may be silicon oxide (SiO2), silicon nitride (SiN), silicon carbide (SiC), silicon oxynitride (SiON), silicon oxycarbide (SiOC), silicon carbonitride (SiCN), silicon oxide carbonitride (SiOCN), another suitable dielectric material, or a combination thereof.

The substrate 102 of FIG. 1 has been simplified for the sake of clarity. It should be noted that additional features can be added to the substrate 102, and some of the features described here can be replaced, modified, or eliminated in other embodiments.

In some embodiments, the dielectric layer 104 may include an upper portion 104b and a lower portion 104a. During fabrication of the semiconductor device 100, the lower portion 104a of the dielectric layer 104 may be formed on the substrate 102, and the conductive layer 106 may be formed on the top surface 104a1 of the lower portion 104a of the dielectric layer 104. After the conductive layer 106 is formed, the upper portion 104b of the dielectric layer 104 may be formed on the conductive layer 106, so the conductive layer 106 may be embedded within the dielectric layer 104, as depicted in FIG. 1. In some embodiments, the upper portion 104b and the lower portion 104a can also be referred to as an upper dielectric layer and a lower dielectric layer, respectively.

The conductive layer 106 may include a plurality of conductive wires 1061, conductive wire 1061a, and a conductive wire 1061b, which may be signal lines, such as word lines or bit lines, of the semiconductor device 100. The conductive wires 1061, 1061a, and 1061b may be tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the conductive wire 1061a may electrically contact a conductive element 108a, and the conductive wire 1061b may electrically contact a conductive element 108b, as shown in FIG. 1. For example, a top surface 108a1 of the conductive element 108a may be substantially coplanar with a top surface 108b1 of the conductive element 108b and the top surface 104a1 of the lower portion 104a of the dielectric layer 104. In addition, the top surface 108a1 of the conductive element 108a, the top surface 108b1 of the conductive element 108b, and the top surface of the lower portion 104a of the dielectric layer 104 may have substantially the same elevation with respect to the top surface 102s1 of the substrate 102.

In some embodiments, the conductive wire 1061a may partially cover the top surface 108a1 of the conductive element 108a. In some embodiments, the conductive wire 1061a may entirely cover the top surface 108a1 of the conductive element 108a. In some embodiments, a portion of the conductive wire 1061b may partially cover the top surface 108b1 of the conductive element 108b. In some embodiments, the conductive wire 1061b may entirely cover the top surface 108b1 of the conductive element 108b.

The conductive elements 108a and 108b may be a metal or a metal alloy such as aluminum, copper, or an alloy thereof. The conductive elements 108a and 108b may penetrate the lower portion 104a of the dielectric layer 104, and a portion of the conductive elements 108a and 108b may protrude downward through the dielectric layer 104.

In some embodiments, the conductive layer 106 may be the bottommost conductive layer (e.g., MO) in an integrated circuit, and one or more dielectric layers including a conductive layer therein can be formed on the dielectric layer 104. In addition, the conductive layer 106 can be electrically connected to conductive layers disposed in upper dielectric layers through one or more conductive vias (not shown).

In some embodiments, a gate oxide 110 may be formed on the top surface 120s1 of the substrate 102. The gate oxide 110 may be a dielectric layer that separates a gate terminal (or gate electrode) 111 of a transistor from the underlying source and drain terminals (not explicitly shown in FIG. 1) formed in the substrate 102 as well as the conductive channel that connects source and drain when the transistor is turned on. In some embodiments, the gate oxide 110 may be formed by thermal oxidation of the silicon of the channel to form a thin insulating layer of silicon dioxide which may have a thickness between 5 to 200 nm, but the present disclosure is not limited thereto.

In some embodiments, the gate terminal 111 can also be regarded as a "gate metal" or "gate conductor". The gate terminal 111 may be a thin electrode layer of a conductor which can be polysilicon, a silicide material, and metal composites, such as WN, TiN, or TaN, but the present disclosure is not limited thereto. In some embodiments, the gate oxide 110 and gate terminal 111 may have substantially the same width, and lateral surfaces of the gate oxide 110 and gate terminal 111 may be coplanar. In some embodiments, the gate oxide 110 and the gate terminal 111 can be collectively regarded as a gate structure (GS) 113.

In some embodiments, an insulating spacer 112a may be formed at a gap between lateral surfaces of the conductive element 108a and the gate structure 113, and another insulating spacer 112a may be formed at a gap between lateral surfaces of the conductive element 108b and the gate structure 113. In some embodiments, the insulating spacers 112a and 112b may be an insulating material such as silicon oxide, silicon nitride, etc., but the present disclosure is not limited thereto.

In some embodiments, there may be electromagnetic noise and/or crosstalk between conductive wires 1061, 1061a, and 1061b. As the semiconductor device 100 is reduced in size, the size and/or pitch of the conductive wires 1061, 1061a, and 1061b may become smaller, and electromagnetic noise or crosstalk therebetween may also become more severe, resulting in higher resistance-capacitance (RC) delay and degraded performance of the semiconductor device 100. A higher RC delay may cause timing errors in digital circuits, and cause distortion of signals in analog circuits.

Figure 2:
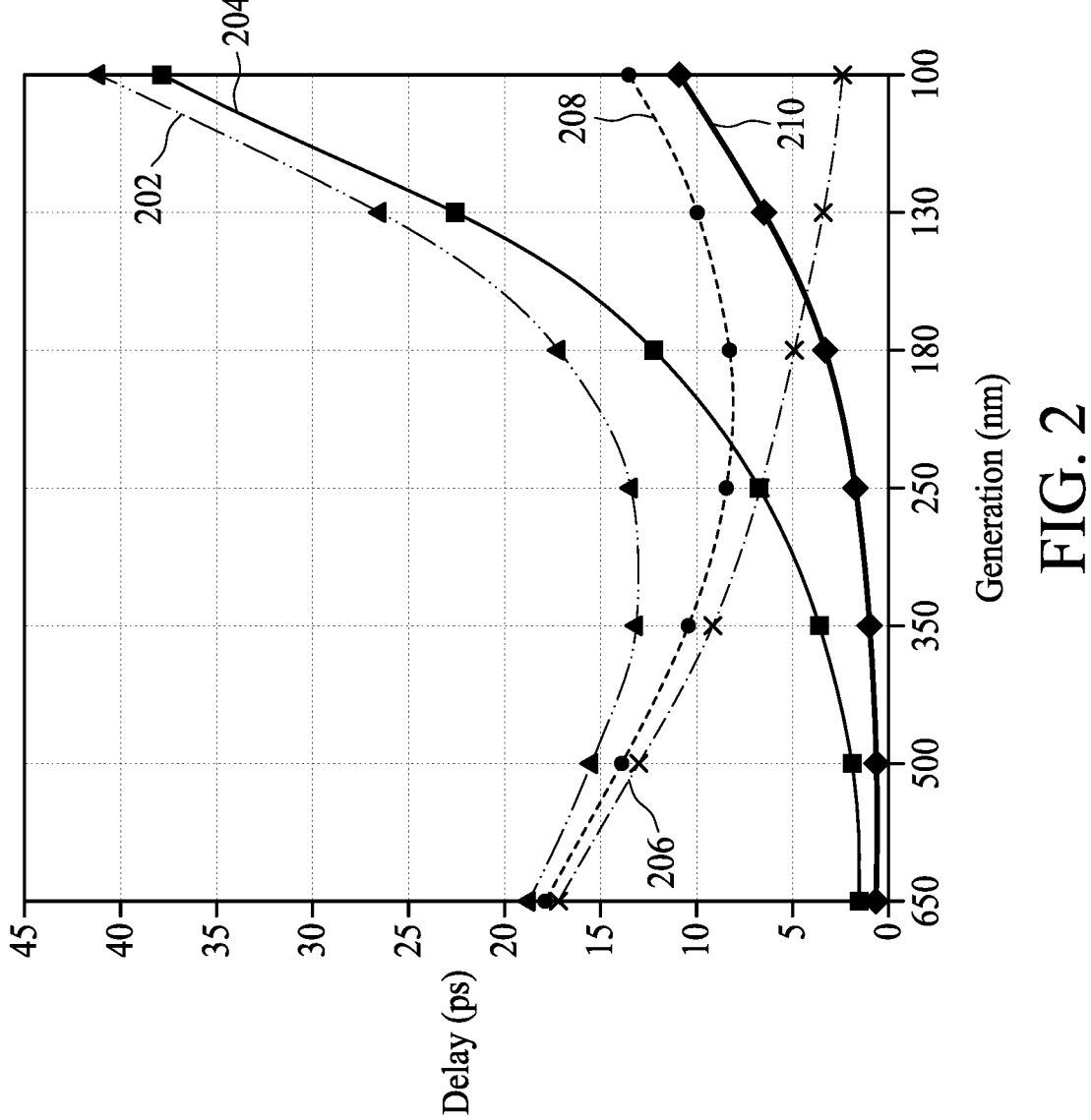
FIG. 2 is a diagram illustrating curves of various delays with respect to different generations of technology nodes in accordance with an embodiment of the present disclosure.

FIG. 2 is a diagram illustrating curves of various delays with respect to different generations of technology nodes in accordance with an embodiment of the present disclosure.

In some embodiments, the delay of a given conductive wire can be expressed by formula (1) as follows.

$$\text{delay} = 2 \times \rho \times \varepsilon_0 \times \kappa \left( \frac{4L^2}{P^2} \times \frac{L^2}{T^2} \right) \tag{1}$$

where $\rho$ denotes the resistivity of the conductive wire; $\varepsilon_0$ denotes absolute permittivity of free space, $\kappa$ denotes the dielectric constant of a dielectric material between the conductive wires, L denotes the length of the conductive wire, T denotes the thickness of the conductive wire, and P denotes the width of the conductive wire. Specifically, $\rho$ may also be referred to as a resistance factor, and K may also be referred to as a capacitance factor.

In some embodiments, the conductive layer 106 may be copper (e.g., having a lower resistance factor) to reduce resistance of the conductive wires 1061, 1061a, and 1061b. In addition, the dielectric layer 104 may be implemented using a low-K dielectric material (e.g., having a lower capacitance factor) where K refers to the dielectric constant. For example, a low-K dielectric material may be a material with a small dielectric constant (e.g., K is approximately equal to 2) relative to silicon dioxide (e.g., K=4.0).

As depicted in FIG. 2, curve 206 illustrates the gate delays with respect to different generations of technology nodes from 650 nm to 100 nm, and the gate delay decreases as the technology node is reduced in size. Curves 204 and 202 respectively illustrate the interconnect delays and total delay using aluminum for the conductive wires and using silicon oxide as the dielectric material formed at the gaps between the conductive wires. As depicted in FIG. 2, the interconnect delay increases rapidly when the technology node is reduced in size, and the total delay decreases as the technology nodes change from 650 nm to 250 nm. However, the total delay increases rapidly as well as the interconnect delay when the technology node is reduced in size. As used herein, the term "technology node" (or "wafer node", "process node", "process technology node", or "node") refers to a parameter in a specific semiconductor manufacturing process and design rules thereof. For example, the technology node used herein may be defined by a minimum gate width of a chip. A smaller technology node corresponds to smaller features, which in turn corresponds to smaller transistors.

Curves 210 and 208 respectively illustrate the interconnect delays and total delay using copper as the conductive wires and using a low-K material as the dielectric material formed at the gaps between the conductive wires.

FIGS. 3A-3G are cross sections showing a method for fabricating a semiconductor device in accordance with an embodiment of the present disclosure. Please refer to FIG. 1 and FIGS. 3A-3G.

Figure 3A:
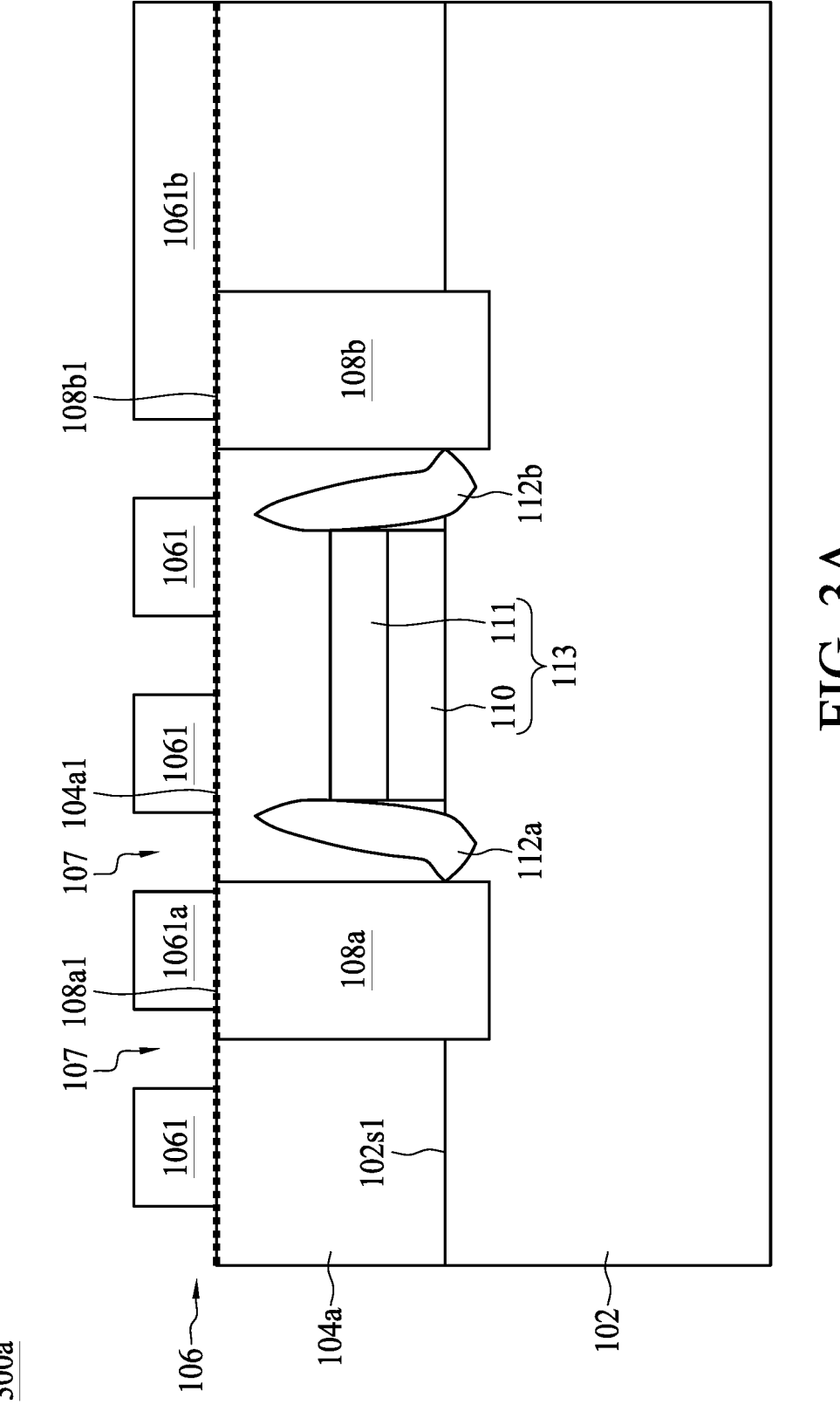
FIGS. 3A-3G are cross sections showing a method for fabricating a semiconductor device in accordance with an embodiment of the present disclosure.

In an embodiment, the semiconductor device 100 shown in FIG. 1 is provided, and a post etching process is performed thereon to remove the upper portion 104b of the dielectric layer 104, so that the conductive layer 106 (i.e., including conductive wires 1061, 1061a, and 1061b) and a portion of the top surface 104a1 of the lower portion 104a are exposed, as shown by the semiconductor structure 300a in FIG. 3A.

Figure 3B:
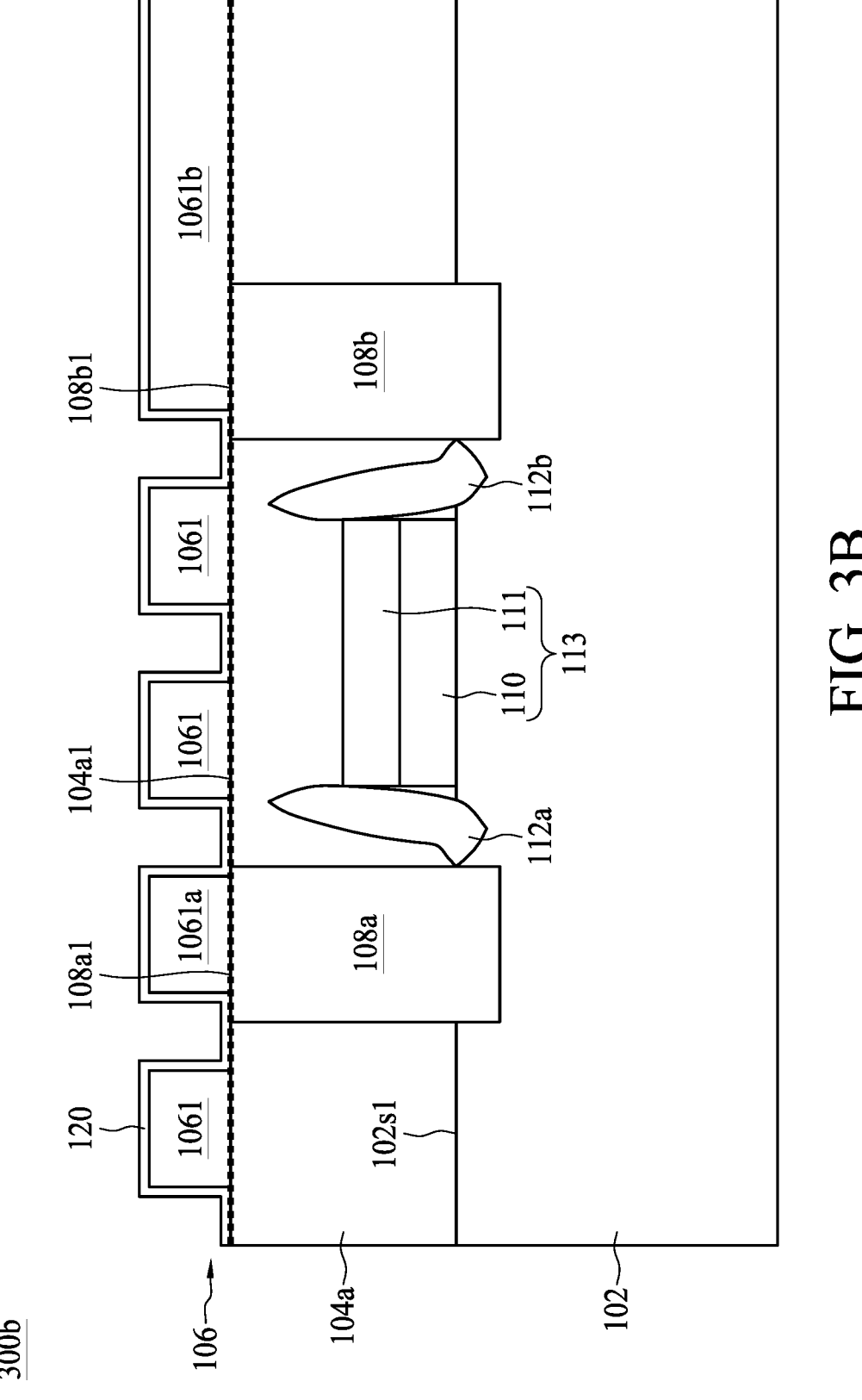

Referring to FIG. 3B, a first insulating layer 120 may be formed on the conductive wires 1061, 1061a, and 1061b and the gaps 107 therebetween in the semiconductor structure 300a shown in FIG. 3A. In some embodiments, the first insulating layer 120 may be formed by thermal oxidation processes, chemical or physical vapor deposition processes, or other suitable techniques. In some embodiments, the thickness of the first insulating layer 120 may be substantially the same. The first insulating layer 120 may include an insulating material such as silicon nitride, but the present disclosure is not limited thereto.

Figure 3C:
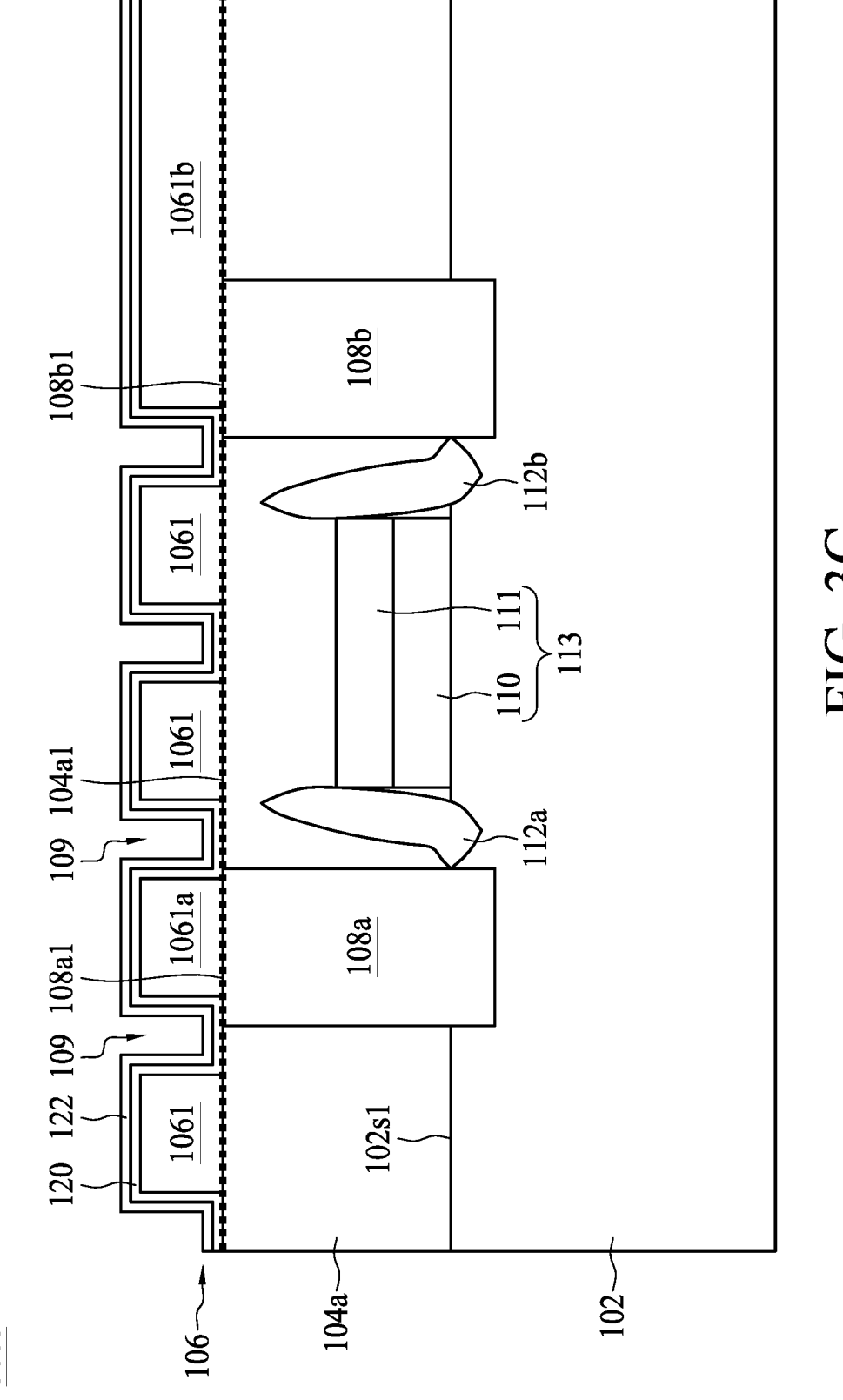

Referring to FIG. 3C, a dielectric layer 122 may be formed on the first insulating layer 120 of the semiconductor structure 300b shown in FIG. 3B. In some embodiments, the dielectric layer 122 may be formed by thermal oxidation processes, chemical or physical vapor deposition processes, or other suitable techniques. In some embodiments, the thickness of the dielectric layer 122 may be substantially the same. The dielectric layer 122 may include a dielectric material such as silicon oxide or other suitable material.

Figure 3D:
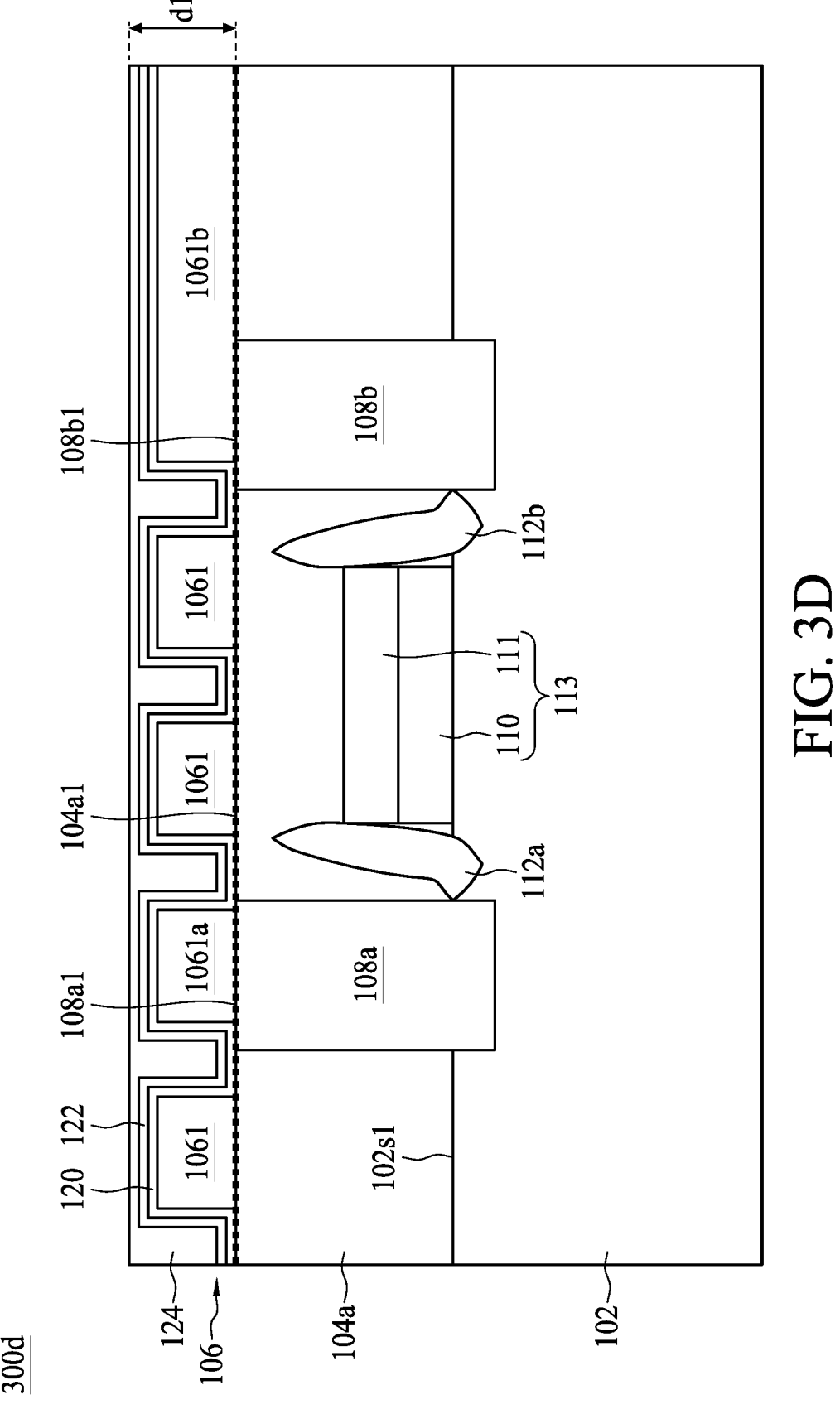

Referring to FIG. 3D, a second insulating layer 124 may be formed on the dielectric layer 122 of the semiconductor structure 300c shown in FIG. 3C. In some embodiments, the second insulating layer 124 may be formed by thermal oxidation processes, chemical or physical vapor deposition processes, or other suitable techniques. In some embodiments, the second insulating layer 124 may fill the gaps 109 along lateral directions of the conductive wires 1061, 1061a, and 1061b, and the top surface 124s1 of the second insulating layer 124 may be substantially level and parallel to the top surface 120s1 of the substrate 102. In addition, the second insulating layer 124 may have a first thickness d1 with respect to the top surface 104a1 of the lower portion 104a of the dielectric layer 104. The second insulating layer 124 may include an insulating material such as silicon nitride, but the present disclosure is not limited thereto.

Figure 3E:
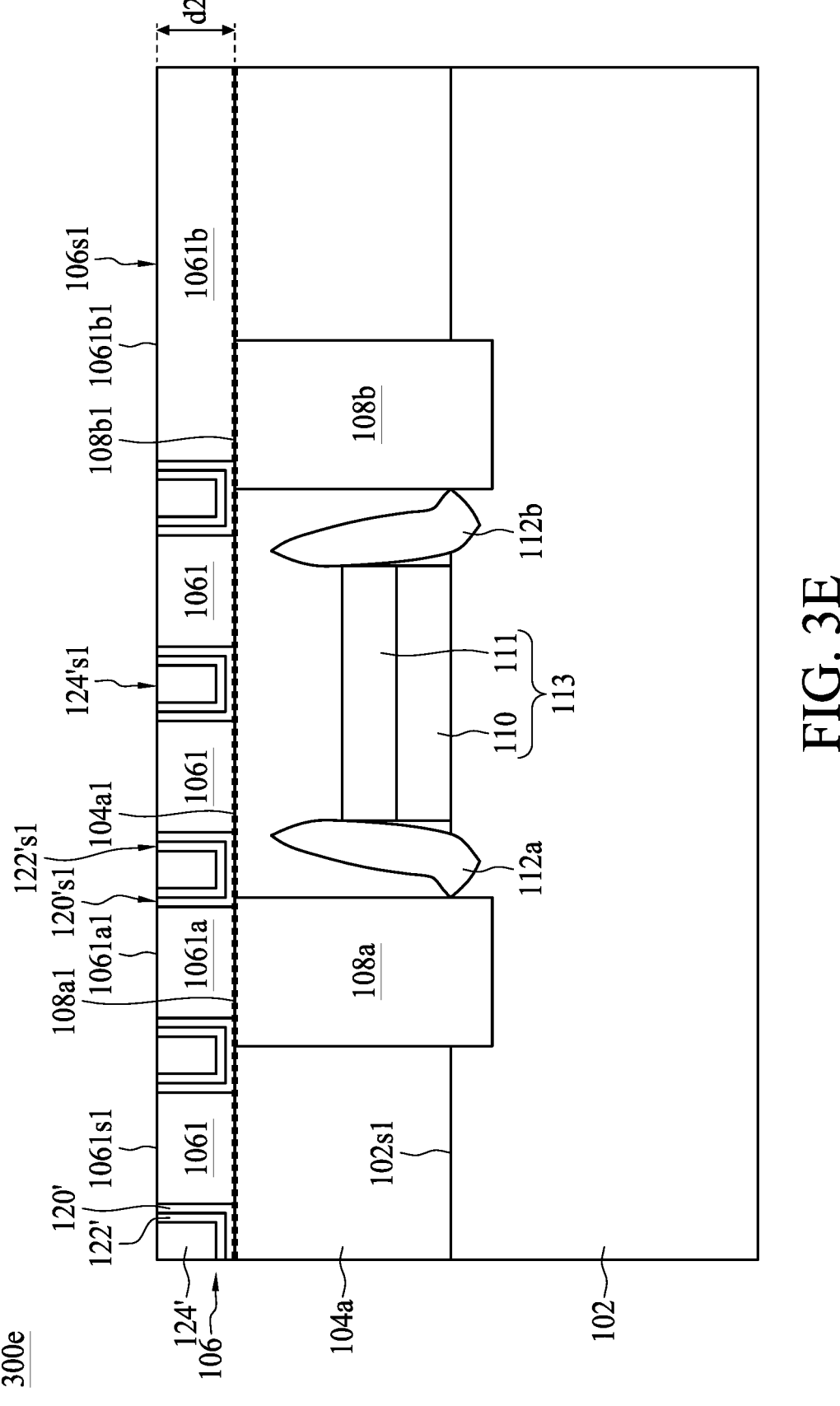

Referring to FIG. 3E, the second insulating layer 124 of the semiconductor structure 300d shown in FIG. 3D may be polished to expose the conductive wires 1061, 1061a, and 1061b. In some embodiments, the second insulating layer 124 may be polished using chemical mechanical polishing (CMP), exposing the top surfaces 1061s1, 1061a1, 1601b1 of the conductive wires 1061, 1061a, and 1061b. In addition, upper ends of the first insulating layer 120 and the dielectric layer 122 are also exposed. The polished second insulating layer 124 may have a second thickness d2 with respect to the top surface 104a1 of the lower portion 104a of the dielectric layer 104. The second thickness d2 is less than the first thickness d1.

Figure 3F:
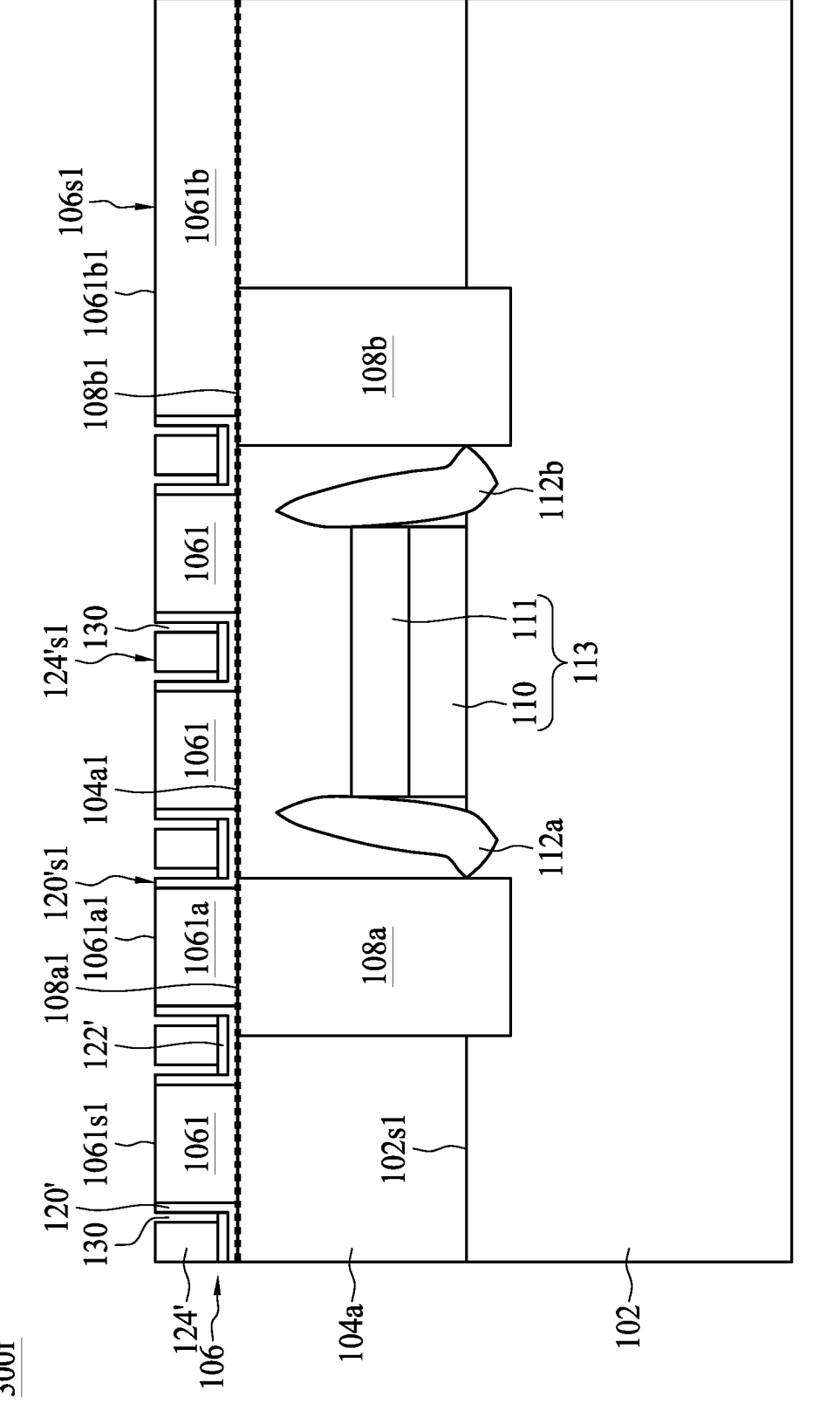

Referring to FIG. 3F, the dielectric layer 122 of the semiconductor structure 300e shown in FIG. 3E is etched to form a plurality of gaps 130 between the conductive wires 1061, 1061a, and 1061b. In some embodiments, the gaps 130 can also be referred to as sidewall gaps along lateral directions of the conductive wires 1061, 1061a, and 1061b.

In some embodiments, the dielectric layer 122 may be etched using a vapor etching process. In some other embodiments, the dielectric layer 122 may be etched using a dry etching or a wet etching process, but the present disclosure is not limited thereto.

Figure 3G:
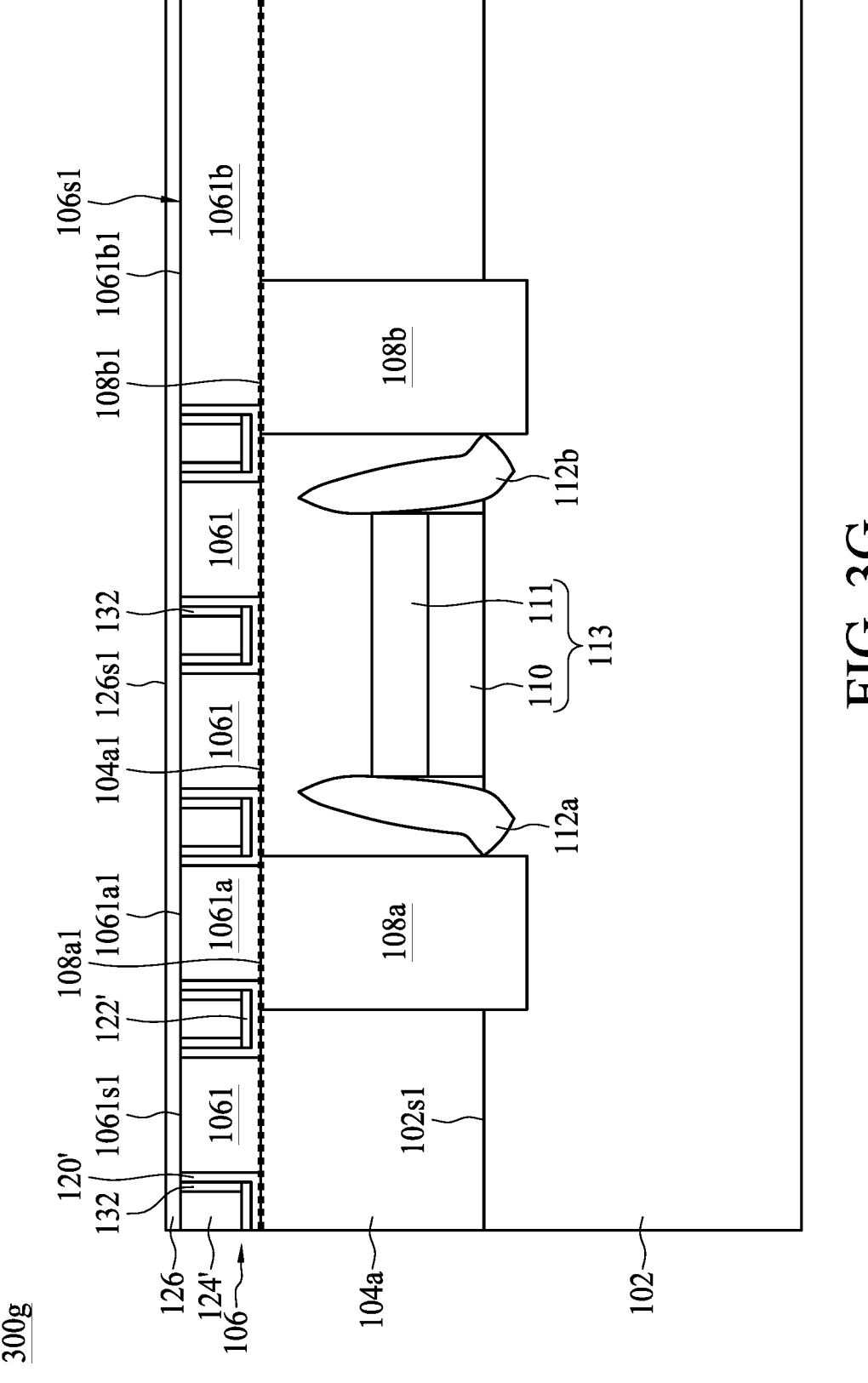

Referring to FIG. 3G, an insulating capping layer 126 may be formed on a top surface 106s1 of the conductive layer 106 to enclose the gaps 130 to form a plurality of air spacers 132. In some embodiments, the air spacers 132 may also be referred to as sidewall spacers of the conductive wires 1061, 1061a, and 1061b. For example, each of the air spacers 132 may be enclosed by the insulating capping layer 132, the remaining first insulating layer 120', the remaining second dielectric layer 122', and the remaining second insulating layer 124'.

More specifically, air has the lowest dielectric constant, substantially equal to 1. Electromagnetic noise and crosstalk between the conductive lines 1061, 1061a, and 1061b can be significantly reduced by the air spacers 132 formed along lateral directions (i.e., sidewalls) of the conductive wires. In some embodiments, the semiconductor structure 300g may be regarded as a semiconductor device including a plurality of sidewall spacers disposed between the conductive lines.

FIG. 4 is a flowchart of a method for fabricating a semiconductor device in accordance with an embodiment of the present disclosure. Please refer to FIG. 1, FIGS. 3A-3G, and FIG. 4.

In step 402, a semiconductor structure (e.g., semiconductor device 100 shown in FIG. 1) is provided, including a conductive layer (e.g., conductor layer 106) disposed on a top surface (e.g., top surface 104a1) of a lower portion (e.g., lower portion 104a) of a first dielectric layer (e.g., dielectric layer 104). In some embodiments, the first dielectric layer 104 of the semiconductor device 100 may include an upper portion 104b and a lower portion 104a, and the conductive layer 106 may be buried between the upper portion 104b and the lower portion 104a. In some other embodiments, the semiconductor device 100 may not include the upper portion 104b of the dielectric layer 104, and the conductive layer 106 can be formed on the top surface 104a1 of the lower portion 104a of the dielectric layer 104.

In step 404, an upper portion (e.g., upper portion 104b) of the first dielectric layer is removed to expose conductive wires (e.g., conductive wires 1061, 1061a, and 1061b) of the conductive layer. In some embodiments, the upper portion of the first dielectric layer may be removed by performing a dry etching, wet etching, or vapor etching process, but the present disclosure is not limited thereto. In addition, after the upper portion is removed, the conductive layer 106 (i.e., including conductive wires 1061, 1061a, and 1061b) and a portion of the top surface 104a1 of the lower portion 104a are exposed, as shown by the semiconductor structure 300a in FIG. 3A.

In step 406, a first insulation layer (e.g., first insulation layer 120 in FIG. 3B) is formed on the conductive wires and first gaps (e.g., gaps 107) therebetween. In some embodiments, the first insulating layer 120 may be formed by thermal oxidation processes, chemical or physical vapor deposition processes, or other suitable techniques. The first insulating layer 120 may include an insulating material such as silicon nitride, but the present disclosure is not limited thereto.

In step 408, a second dielectric layer (e.g., dielectric layer 120 shown in FIG. 3C) is formed on the first insulation layer. In some embodiments, the dielectric layer 122 may be formed by thermal oxidation processes, chemical or physical vapor deposition processes, or other suitable techniques. The dielectric layer 122 may include a dielectric material such as silicon oxide or other suitable material.

In step 410, a second insulation layer (e.g., second insulation layer 124 shown in FIG. 3D) is formed the second dielectric layer. In some embodiments, the second insulating layer 124 may be formed by thermal oxidation processes, chemical or physical vapor deposition processes, or other suitable techniques. In some embodiments, the gaps 109 may refer to gaps of the dielectric layers 122 along lateral directions. The second insulating layer 124 may fill the gaps 109 along lateral directions. The top surface 124s1 of the second insulating layer 124 may be substantially level and parallel to the top surface 120s1 of the substrate 102. In addition, the second insulating layer 124 may have a first thickness d1 with respect to the top surface 104a1 of the lower portion 104a of the dielectric layer 104. The second insulating layer 124 may include an insulating material such as silicon nitride, but the present disclosure is not limited thereto.

In step 412, the second insulation layer (e.g., second insulation layer 124 shown in FIG. 3D) is polished to expose the conductive wires, the first insulation layer, and the second dielectric layer. In some embodiments, the second insulating layer 124 may be polished using a chemical mechanical polishing (CMP) process, so the top surfaces 1061s1, 1061a1, 1601b1 of the conductive wires 1061, 1061a, and 1061b are exposed. In addition, upper ends of the first insulating layer 120 and the dielectric layer 122 are also exposed. The polished second insulating layer 124 may have a second thickness d2 with respect to the top surface 104a1 of the lower portion 104a of the dielectric layer 104. The second thickness d2 is less than the first thickness d1.

In step 414, the second dielectric layer (e.g., dielectric layer 122 shown in FIG. 3E) is etched to obtain a plurality of second gaps (e.g., gaps 130 shown in FIG. 3F) between the conductive wires. In some embodiments, the gaps 130 can also be referred to as sidewall gaps along lateral directions of the conductive wires 1061, 1061a, and 1061b. In some embodiments, the dielectric layer 122 may be etched using a vapor etching process. In some other embodiments, the dielectric layer 122 may be etched using a dry etching or a wet etching process, but the present disclosure is not limited thereto.

In step 416, an insulating capping layer (e.g., insulating capping layer 126 shown in FIG. 3G) is formed on a second top surface (e.g., top surface 106s1 shown in FIG. 3G) of the conductive layer to enclose the second gaps to form a plurality of air spacers (e.g., air spacers 132 shown in FIG. 3G). More specifically, air has the lowest dielectric constant, substantially equal to 1. Electromagnetic noise and crosstalk between the conductive lines 1061, 1061a, and 1061b can be significantly reduced by the air spacers 132 along lateral directions (i.e., sidewalls) of the conductive wires.

One aspect of the present disclosure provides a semiconductor device, which includes a substrate, a first dielectric layer, a conductive layer, and an insulating capping layer. The first dielectric layer is disposed on the substrate. The conductive layer is disposed on the first dielectric layer. The conductive layer comprises a plurality of conductive wires. The insulating capping layer is disposed on the conductive layer, and configured to enclose a plurality of first gaps between the conductive wires to form a plurality of air spacers.

In some embodiments, the semiconductor device further includes a first insulating layer, disposed on the conductive wires.

In some embodiments, the semiconductor device further includes a second dielectric layer, disposed on the first insulating layer.

In some embodiments, the semiconductor device further includes a second insulating layer, disposed on the second dielectric layer, and fills a plurality of second gaps of the second dielectric layer along lateral directions.

In some embodiments, the second insulating layer, the first insulating layer, and the second dielectric layer above a first top surface of the conductive layer are polished, so that a remaining first insulating layer and a remaining second dielectric layer are exposed.

In some embodiments, the first top surface of the conductive layer is coplanar with a second top surface of a remaining second insulating layer, a third top surface of the remaining first insulating layer, and a fourth top surface of the remaining second dielectric layer.

In some embodiments, the second insulating layer, the first insulating layer, and the second dielectric layer are polished using a chemical mechanical polishing process.

In some embodiments, the remaining second dielectric layer is etched to form the plurality of first gaps.

In some embodiments, the remaining second dielectric layer is etched using a vapor etching process.

In some embodiments, the second dielectric layer includes silicon oxide.

In some embodiments, the insulating capping layer, the first insulating layer, and the second insulating layer are made of a first insulating material.

In some embodiments, the first insulating material is silicon nitride.

In some embodiments, each air spacer is surrounded by the insulating capping layer, the remaining first insulating layer, the remaining second dielectric layer, and the remaining second insulating layer.

In some embodiments, the semiconductor device further includes a gate structure a first conductive element, a second conductive element, a first spacer, and a second spacer. The gate structure is disposed on a top surface of the substrate. The first conductive element is in contact with a first conductive wire among the conductive wires. The second conductive element is in contact with a second conductive wire among the conductive wires. The first spacer is disposed between the first conductive element and the gate structure. The second spacer is disposed between the second conductive element and the gate structure.

In some embodiments, the first spacer and the second spacer are made of an insulating material.

In some embodiments, the gate structure includes a gate oxide, and a gate terminal. The gate oxide is disposed on the top surface of the substrate. The gate terminal is disposed on the gate oxide.

Another aspect of the present disclosure provides a method for fabricating a semiconductor device. The method includes the following steps: providing a semiconductor structure having a conductive layer disposed on a first top surface of a lower portion of a first dielectric layer; etching an upper portion of the first dielectric layer to expose conductive wires of the conductive layer; and forming an insulating capping layer on a second top surface of the conductive layer to form a plurality of air spacers.

In some embodiments, after etching an upper portion of the first dielectric layer to expose conductive wires of the conductive layer, the method further includes the following step: forming a first insulating layer on the conductive wires and first gaps therebetween.

In some embodiments, after forming a first insulating layer on the conductive wires and first gaps therebetween, the method further includes the following step: forming a second dielectric layer on the first insulating layer.

In some embodiments, after forming a second dielectric layer on the first insulation layer, the method further includes the following step: forming a second insulating layer on the second dielectric layer, wherein the second insulating layer fills a plurality of second gaps of the second dielectric layer along lateral directions thereof.

In some embodiments, after forming a second insulating layer on the second dielectric layer, the method further includes the following step: polishing the second insulating layer to expose the conductive wires, the first insulating layer, and the second dielectric layer.

In some embodiments, the second top surface of the conductive layer is coplanar with a third top surface of a remaining second insulating layer, a fourth top surface of a remaining first insulating layer, and a fifth top surface of a remaining second dielectric layer.

In some embodiments, after polishing the second insulating layer to expose the conductive wires, the first insulating layer, and the second dielectric layer, the method further includes: etching the second dielectric layer to obtain a plurality of second gaps between the conductive wires.

In some embodiments, the method further includes the following step: forming the insulating capping layer on the second top surface of the conductive layer to enclose the second gaps to form the air spacers.

Yet another aspect of the present disclosure provides a semiconductor structure. The semiconductor structure includes a substrate, a first dielectric layer, a plurality of conductive wires, and a plurality of air spacers. The first dielectric layer is disposed on the substrate. The plurality of conductive wires are disposed on the first dielectric layer. The plurality of air spacers are disposed at a plurality of first gaps between the conductive wires along lateral directions of the conductive wires.

In some embodiments, the semiconductor structure further includes a first insulating layer, disposed on the conductive wires.

In some embodiments, the semiconductor structure further includes a second dielectric layer, disposed on the first insulating layer.

In some embodiments, the semiconductor structure further includes a second insulating layer, disposed on the second dielectric layer, and fills a plurality of second gaps of the second dielectric layer along lateral directions.

In some embodiments, the second insulating layer, the first insulating layer, and the second dielectric layer above first top surfaces of the conductive wires are polished, so that a remaining first insulating layer and a remaining second dielectric layer are exposed.

In some embodiments, the remaining second dielectric layer is etched to form a plurality of second gaps.

In some embodiments, the semiconductor structure further includes an insulating capping layer, disposed on the first top surfaces of the conductive wires to enclose the second gaps to form the air spacers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a first dielectric layer, disposed on the substrate;
a conductive layer, disposed on the first dielectric layer, wherein the conductive layer comprises a plurality of conductive wires disposed on and in contact with a top surface of the first dielectric layer; and
an insulating capping layer, disposed on and in contact with top surfaces of the conductive wires of the conductive layer, and configured to enclose a plurality of first gaps between the conductive wires to form a plurality of air spacers, wherein top openings of the air spacers are coplanar with the top surfaces of the conductive wires and are enclosed by the insulating capping layer;
a first insulating layer having a horizontal portion in contact with the top surface of the first dielectric layer and a vertical portion in contact with a lateral surface of one of the conductive wires, wherein the vertical portion of the first insulating layer is located between one of the conductive wires and one of the air spacers; and
a second dielectric layer disposed on and in contact with the horizontal portion of the first insulating layer, such that the horizontal portion of the first insulating layer is positioned between the first dielectric layer and the second dielectric layer;
wherein bottom openings of the air spacers are enclosed by a top surface of the second dielectric layer, such that a height of each of the air spacers is less than a thickness of each of the conductive wires;
wherein a top surface of the vertical portion of the first insulating layer and the top surfaces of the conductive wires are coplanar with each other and are in contact with the insulating capping layer.

2. The semiconductor device of claim 1, further comprising a conductive element disposed on the substrate and adjacent to the first dielectric layer, wherein at least one of the conductive wires is in contact with a top surface of the conductive element.

3. The semiconductor device of claim 2, wherein the top surface of the first dielectric layer is coplanar with the top surface of the conductive element.

4. The semiconductor device of claim 1, further comprising a second insulating layer, disposed on the second dielectric layer, and filling a plurality of second gaps of the second dielectric layer along lateral directions, wherein each of the air spacers is located between the second insulating layer and the vertical portion of the first insulating layer, such that each of the air spacers is enclosed by the insulating capping layer, the first insulating layer, the second dielectric layer, and the second insulating layer, wherein a top surface of the second insulating layer is in contact with the insulating capping layer.

5. The semiconductor device of claim 4, wherein the second insulating layer, the first insulating layer, and the second dielectric layer above a first top surface of the conductive layer are polished.

6. The semiconductor device of claim 5, wherein the top openings of the air spacers are coplanar with the top surface of the second insulating layer, such that the height of each of the air spacers is equal to a thickness of the second insulating layer.

7. The semiconductor device of claim 6, wherein the second insulating layer, the first insulating layer, and the second dielectric layer are polished using a chemical mechanical polishing process.

8. The semiconductor device of claim 3, wherein the second dielectric layer comprises silicon oxide.

9. The semiconductor device of claim 4, wherein the insulating capping layer, the first insulating layer, and the second insulating layer are made of a first insulating material.

10. The semiconductor device of claim 9, wherein the first insulating material comprises silicon nitride.

11. The semiconductor device of claim 4, wherein each of the air spacers is located above the second dielectric layer and the horizontal portion of the first insulating layer.

12. A semiconductor structure, comprising:

a substrate;

a first dielectric layer, disposed on the substrate;

a plurality of conductive wires, disposed on in contact with a top surface of the first dielectric layer;

a plurality of air spacers, disposed at a plurality of first gaps between the conductive wires along lateral directions of the conductive wires;

a first insulating layer having a horizontal portion in contact with the top surface of the first dielectric layer and a vertical portion in contact with a lateral surface of one of the conductive wires, wherein the vertical portion of the first insulating layer is located between the one of the conductive wires and one of the air spacers;

a second dielectric layer disposed on and in contact with the horizontal portion of the first insulating layer, such that the horizontal portion of the first insulating layer is positioned between the first dielectric layer and the second dielectric layer; and a second insulating layer disposed on the second dielectric layer, wherein each of the air spacers is located above the second dielectric layer and the horizontal portion of the first insulating layer;

wherein top openings of the air spacers are coplanar with first top surfaces of the conductive wires while bottom openings of the air spacers are enclosed by a top surface of the second dielectric layer, such that a height of each of the air spacers is less than a thickness of each of the conductive wires;

wherein a top surface of the vertical portion of the first insulating layer and the top surfaces of the conductive wires are coplanar with each other.

13. The semiconductor structure of claim 12 wherein each of the air spacers is located between the second insulating layer and the vertical portion of the first insulating layer, such that each of the air spacers is enclosed by the first insulating layer, the second dielectric layer, and the second insulating layer.

14. The semiconductor structure of claim 13, wherein the second insulating layer, the first insulating layer, and the second dielectric layer above the first top surfaces of the conductive wires are polished.

15. The semiconductor structure of claim 14, wherein a width of each of the air spacers is equal to a distance between the second insulating layer and the vertical portion of the first insulating layer.

16. The semiconductor structure of claim 15, further comprising:

an insulating capping layer, disposed on the first top surfaces of the conductive wires to enclose the top openings the air spacers.

\* \* \* \* \*